(12) United States Patent
Chiu et al.

(10) Patent No.: US 12,666,871 B2
(45) Date of Patent: Jun. 23, 2026

(54) PACKAGE STRUCTURE OF PIEZOELECTRIC MICROMACHINED ULTRASONIC TRANSDUCER

(71) Applicant: SonicMEMS (ZhengZhou) Technology Co., Ltd., Zhengzhou (CN)

(72) Inventors: Yi-Hsiang Chiu, Zhengzhou (CN); Rei Jinchi, Zhengzhou (CN)

(73) Assignee: SONICMEMS (ZHENGZHOU) TECHNOLOGY CO., LTD., Zhengzhou (CN)

( * ) Notice: Subject to any disclaimer, the term of this patent is extended or adjusted under 35 U.S.C. 154(b) by 787 days.

(21) Appl. No.: 18/176,132

(22) Filed: Feb. 28, 2023

(65) Prior Publication Data

US 2024/0237539 A1 Jul. 11, 2024

(30) Foreign Application Priority Data

Jan. 11, 2023 (TW) ................................. 112200360

(51) Int. Cl.
*H10N 30/00* (2023.01)
*H10N 30/20* (2023.01)
*H10N 30/87* (2023.01)

(52) U.S. Cl.
CPC ....... *H10N 30/2047* (2023.02); *H10N 30/875* (2023.02)

(58) Field of Classification Search
CPC . H10N 30/2047; H10N 30/875; B06B 1/0666
See application file for complete search history.

(56) References Cited

U.S. PATENT DOCUMENTS

2022/0023915 A1* 1/2022 Qian ................... B81C 1/00158
2024/0136994 A1* 4/2024 Xia ........................ H03H 9/178

* cited by examiner

*Primary Examiner* — Julio C. Gonzalez
*Assistant Examiner* — Abdullah A Riyami
(74) *Attorney, Agent, or Firm* — MUNCY, GEISSLER, OLDS & LOWE, P.C.

(57) ABSTRACT

A package structure of a piezoelectric micromachined ultrasonic transducer includes a silicon substrate, a first protective layer, a piezoelectric composite film, a first metal layer, a second metal layer, a first pad, a second pad and a second protective layer. The silicon substrate is provided with a first through hole and a second through hole. The first protective layer is provided with a groove, a first communication hole and a second communication hole. The piezoelectric composite film includes a first electrode layer and a second electrode layer respectively filling the first communication hole and the first through hole, and the second communication hole and the second through hole so as to be connected to the first metal layer and the second metal layer. A surface of the second protective layer away from the piezoelectric composite film is a flat surface.

10 Claims, 3 Drawing Sheets

PACKAGE STRUCTURE OF PIEZOELECTRIC MICROMACHINED ULTRASONIC TRANSDUCER

CROSS-REFERENCE TO RELATED APPLICATION

This non-provisional application claims priority under 35 U.S.C. § 119(a) to Patent Application No. 112200360 filed in Taiwan, R.O.C. on Jan. 11, 2023, the entire contents of which are hereby incorporated by reference.

BACKGROUND

Technical Field

The disclosure relates to the field of sensing, in particular to a package structure of a piezoelectric micromachined ultrasonic transducer.

Related Art

Piezoelectric micromachined ultrasonic transducers are more and more widely used in sensing applications of various electronic devices. At the same time, as the electronic devices are becoming lighter and thinner, the overall thickness of the internal space is limited. The thickness of the piezoelectric micromachined ultrasonic transducer also limits the design margin of the electronic devices.

Currently, the major bottleneck of the piezoelectric micromachined ultrasonic transducer lies in the thickness of the welding part, which is traditionally and usually provided with a pad opening at the top, making it difficult to reduce the overall thickness. The lack of a flat surface on the overall piezoelectric micromachined ultrasonic transducer that can be glued to the electronic device also causes limitations in design.

SUMMARY

In order to solve the problems in the related art, the disclosure provides a package structure of a piezoelectric micromachined ultrasonic transducer, including a silicon substrate, a first protective layer, a piezoelectric composite film, a first metal layer, a second metal layer, a first pad, a second pad and a second protective layer.

The silicon substrate is provided with a first through hole and a second through hole. The first protective layer is on the silicon substrate and provided with a groove, a first communication hole and a second communication hole. The first communication hole communicates with the first through hole, the second communication hole communicates with the second through hole, and the first communication hole and the second communication hole do not communicate with the groove. The piezoelectric composite film is on the first protective layer. A vertical projection of the piezoelectric composite film at least partially overlaps with the groove. The piezoelectric composite film includes a first electrode layer and a second electrode layer. A first connecting portion of the first electrode layer is exposed to the first communication hole and first through hole, and a second connecting portion of the second electrode layer is exposed to the second communication hole and the second through hole. The first metal layer and the second metal layer respectively fill the first communication hole and the first through hole and are connected to the first electrode layer, and fill the second communication hole and the second through hole and are connected to the second electrode layer. The first pad and the second pad are at a side of the silicon substrate opposite to the first protective layer and respectively connected to the first metal layer and the second metal layer. The second protective layer is on the piezoelectric composite film. A surface of the second protective layer away from the piezoelectric composite film is a flat surface, and the second protective layer and the piezoelectric composite film jointly close the groove to form an enclosed cavity.

In some examples, a metal bottom layer is further included between the first communication hole, the first through hole and the first metal layer, and between the second communication hole, the second through hole and the second metal layer.

In some examples, the piezoelectric composite film is provided with at least two communication channels. The two communication channels run through the piezoelectric composite film and communicate with the groove, and the second protective layer fills the two communication channels and closes the groove to form the enclosed cavity.

In more detail, in some examples, the package structure of a piezoelectric micromachined ultrasonic transducer further includes a support column. The support column is in the enclosed cavity and abuts against the piezoelectric composite film and the first protective layer. A minimum distance between a side wall surface of the enclosed cavity and the support column is a first distance. A second distance between the two communication channels is greater than twice the first distance. A ratio of a height of the support column to the first distance is 1/70 to 1/200. A width of the support column is 3 um to 10 um. Areas in the enclosed cavity other than the support column communicate with each other.

In more detail, in some examples, the package structure of a piezoelectric micromachined ultrasonic transducer further includes a second support column. The second support column is in the enclosed cavity. The second support column abuts against the piezoelectric composite film and the first protective layer, and areas in the enclosed cavity other than the support column and the second support column communicate with each other.

In some examples, the first distance is less than or equal to 150 um. More specifically, in some examples, the first distance is 10 um to 40 um.

In some examples, the piezoelectric composite film includes a first piezoelectric layer, the first electrode layer, a second piezoelectric layer and the second electrode layer sequentially stacked on the first protective layer. The first piezoelectric layer is provided with a first opening to expose the first connecting portion, and the first piezoelectric layer and the second piezoelectric layer are provided with a second opening to expose the second connecting portion.

In more detail, in some examples, the piezoelectric composite film further includes a third piezoelectric layer. The third piezoelectric layer covers the second electrode layer and contacts the second protective layer.

In more detail, in some examples, a thickness of the first piezoelectric layer is 10 nm to 40 nm. A thickness of the first electrode layer and the second electrode layer is 150 nm to 300 nm. A thickness of the second piezoelectric layer is 800 nm to 1200 nm. A thickness of the third piezoelectric layer is 150 nm to 250 nm. A thickness of the second protective layer is 1.6 um to 2.4 um, and a distance between the first protective layer and the first piezoelectric layer is 800 nm to 1200 nm.

It can be understood from the aforementioned examples that through the silicon perforation technology, the overall pad can be transferred to the back of the piezoelectric micromachined ultrasonic transducer, so that a complete flat surface can be provided to facilitate a flat attachment to the surface of the electronic device, and the overall thickness of the package structure can be reduced, which facilitates assembly design of various electronic devices.

DETAILED DESCRIPTION

Figure 1:
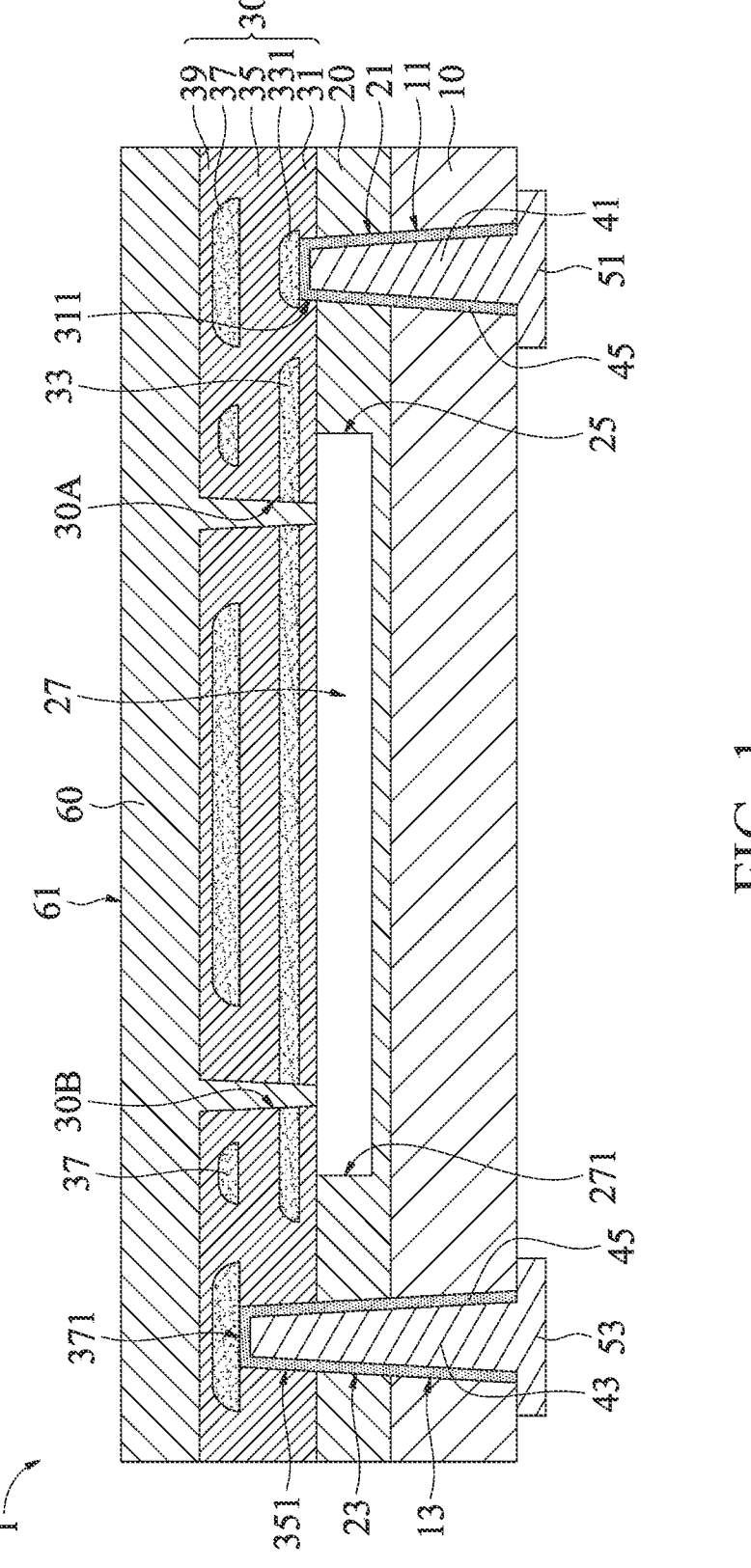
FIG. 1 is a schematic cross-sectional view of a package structure of a piezoelectric micromachined ultrasonic transducer according to Example I.

In the following description, the terms "first", "second" and "third" are only used to distinguish one element, component, area or part from another element, component, area, layer or part, and do not indicate their necessary order. Besides, relative terms such as "lower" and "upper", and "inner" and "outer" may be used herein to describe the relationship of one element to another, and it should be understood that relative terms are intended to include different orientations of the device other than those shown in the drawings. For example, if the device in one drawing is turned over, the element described as being on the "lower" side of the other element will be oriented on the "upper" side of the other element. This only indicates the relative orientation relationship, not the absolute orientation relationship.

In the drawings, the widths of some elements, areas and the like are enlarged for clarity. Throughout this specification, same reference numerals refer to same elements. It should be understood that when, for example, an element is defined as being "on" or "connected to" another element, it may be directly on or connected to another element, or there may also be an intermediate element. On the contrary, when an element is defined to be "directly on" or "directly connected to" another element, there is no intermediate element.

FIG. 1 is a schematic cross-sectional view of a package structure of a piezoelectric micromachined ultrasonic transducer according to Example I. As shown in FIG. 1, a package structure 1 of a piezoelectric micromachined ultrasonic transducer includes a silicon substrate 10, a first protective layer 20, a piezoelectric composite film 30, a first metal layer 41, a second metal layer 43, a first pad 51, a second pad 53 and a second protective layer 60.

The silicon substrate 10 is provided with a first through hole 11 and a second through hole 13. The first protective layer 20 is on the silicon substrate 10 and provided with a groove 25, a first communication hole 21 and a second communication hole 23. The first communication hole 21 communicates with the first through hole 11, the second communication hole 23 communicates with the second through hole 13, and the first communication hole 21 and the second communication hole 23 do not communicate with the groove 25. Here, the first protective layer 20 may be made of silicon dioxide or tetraethoxysilane (TEOS).

The piezoelectric composite film 30 is on the first protective layer 20. A vertical projection of the piezoelectric composite film 30 at least partially overlaps with the groove 25. The piezoelectric composite film 30 includes a first electrode layer 33 and a second electrode layer 37. A first connecting portion 331 of the first electrode layer 33 is exposed to the first communication hole 21 and first through hole 11, and a second connecting portion 371 of the second electrode layer 37 is exposed to the second communication hole 23 and the second through hole 13. The first metal layer 41 fills the first communication hole 21 and the first through hole 11 and is connected to the first connecting portion 331. The second metal layer 43 fills the second communication hole 23 and the second through hole 13 and are connected to the second connecting portion 371. The first pad 51 and the second pad 53 are at a side of the silicon substrate 10 opposite to the first protective layer 20 and respectively connected to the first metal layer 41 and the second metal layer 43. The second protective layer 60 is on the piezoelectric composite film 30. A surface 61 of the second protective layer 60 away from the piezoelectric composite film 30 is a flat surface, and the second protective layer 60 and the piezoelectric composite film 30 jointly close the groove 25 to form an enclosed cavity 27. Here, the enclosed cavity 27 may be a space of the groove 25 (i.e., the bottoms of the piezoelectric composite film 30 and the second protective layer 60 may be coplanar), or the space of the groove 25 plus the bottoms of the piezoelectric composite film 30 and the second protective layer 60.

More specifically, in some examples, the piezoelectric composite film 30 is provided with at least two communication channels 30A, 30B. The two communication channels 30A, 30B run through the piezoelectric composite film 30 and communicate with the groove 25, and the second protective layer 60 fills the two communication channels 30A, 30B and closes the groove 25 to form the enclosed cavity 27. Here, the communication channels 30A, 30B may actually be used as etching channels for etching amorphous silicon originally reserved in the groove 25 in the first protective layer 20, so that etching gas can be introduced to form the groove 25. The second protective layer 60 may completely fill the communication channels 30A, 30B, or only close upper ends of the communication channels 30A, 30B, leaving a part of the space as a part of the enclosed cavity 27. Here, the second protective layer 60 may be made of silicon dioxide or tetraethoxysilane (TEOS). However, the above is only an example, and the disclosure is not limited thereto. For example, the groove 25 can be maintained by vacuum bonding instead of the communication channels 30A, 30B.

In some examples, the piezoelectric composite film 30 includes a first piezoelectric layer 31, the first electrode layer 33, a second piezoelectric layer 35 and the second electrode layer 37 sequentially stacked on the first protective layer 20. The first piezoelectric layer 31 is provided with a first opening 311 to expose the first connecting portion 331, and the first piezoelectric layer 31 and the second piezoelectric layer 35 are provided with a second opening 351 to expose the second connecting portion 371. Here, the second opening 351 runs through the first piezoelectric layer 31 and the second piezoelectric layer 35.

Further, in some examples, the piezoelectric composite film 30 further includes a third piezoelectric layer 39. The third piezoelectric layer 39 covers the second electrode layer 37 and contacts the second protective layer 60. In the foregoing example, a material of the first piezoelectric layer 31, the second piezoelectric layer 35 and the third piezoelectric layer 39 is aluminum nitride (AlN), and a material of the first electrode layer 33 and the second electrode layer 37 is molybdenum (Mo).

In more detail, a thickness of the first piezoelectric layer 31 is 10 nm to 40 nm. A thickness of the first electrode layer 33 and the second electrode layer 37 is 150 nm to 300 nm. A thickness of the second piezoelectric layer 37 is 0.8 um to 1.2 um. A thickness of the third piezoelectric layer 39 is 150 nm to 250 nm. A thickness of the second protective layer 60 is 1.6 um to 2.4 um, and a distance between the first protective layer 20 and the first piezoelectric layer 31 is 800 nm to 1200 nm.

In addition, a material of the first metal layer 41, the second metal layer 43, the first pad 51 and the second pad 53 may be aluminum, copper or an alloy thereof. Further, a metal bottom layer 45 is further included between the first communication hole 21, the first through hole 11 and the first metal layer 41, and between the second communication hole 23, the second through hole 13 and the second metal layer 43. The metal bottom layer 45 may serve as a crystal growth layer, and may be made of a copper-aluminum alloy.

Figure 2:
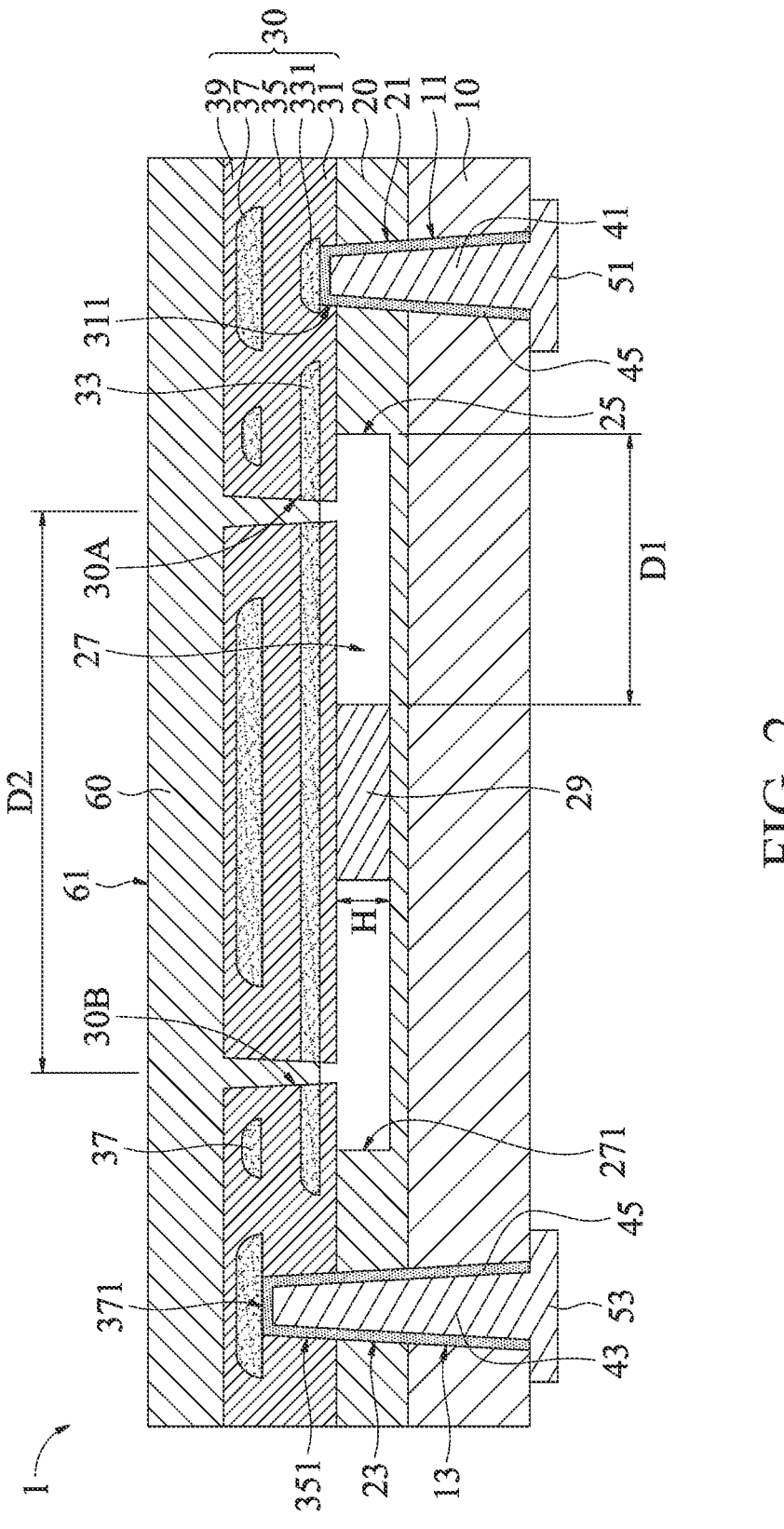
FIG. 2 is a schematic cross-sectional view of a package structure of a piezoelectric micromachined ultrasonic transducer according to Example II.

FIG. 2 is a schematic cross-sectional view of a package structure of a piezoelectric micromachined ultrasonic transducer according to Example II. As shown in FIG. 2, referring to FIG. 1, Example II further includes a support column 29 in the enclosed cavity 27. The support column 29 abuts against the piezoelectric composite film 30 and the first protective layer 20, which can prevent the piezoelectric composite film 30 from attracting or contacting the first protective layer 20 when vacuumizing the enclosed cavity 27. Typically, the support column 29 is produced by patterning the first protective layer 20 or controlling etching conditions. The support column 29 may be made of amorphous silicon, silicon dioxide or tetraethoxysilane (TEOS). A minimum distance between a side wall surface 271 of the enclosed cavity 27 and the support column 29 is a first distance D1. A second distance D2 between the two communication channels 30A, 30B is greater than twice the first distance D1. A ratio of a height H of the support column to the first distance D1 is 1/70 to 1/200. A width of the support column 29 is 3 um to 10 um. Areas in the enclosed cavity 27 other than the support column 29 communicate with each other, i.e., the enclosed cavity 27 exhibits an annular space centered on the support column 29. In some examples, the first distance D1 is less than or equal to 150 um. Preferably, the first distance D1 is 10 um to 40 um.

Figure 3:
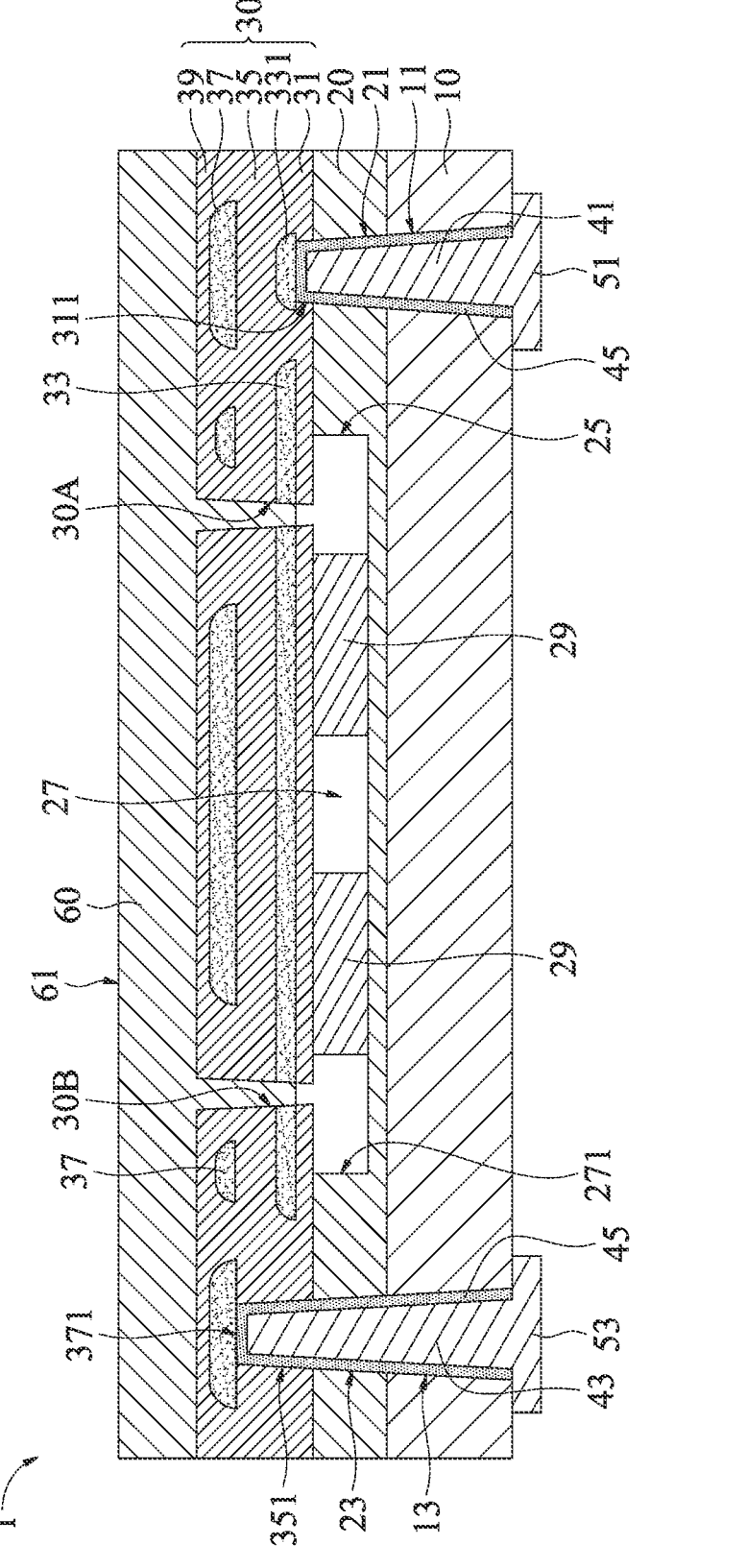
FIG. 3 is a schematic cross-sectional view of a package structure of a piezoelectric micromachined ultrasonic transducer according to Example III.

FIG. 3 is a schematic cross-sectional view of a package structure of a piezoelectric micromachined ultrasonic transducer according to Example III. As shown in FIG. 3, referring to FIG. 2, in Example III, the enclosed cavity 27 further includes two support columns 29. However, this is only an example and is not intended to be limiting, and actually there may be a plurality of support columns 29. Through the support column 29, the height of the enclosed cavity 27 can be further reduced, thereby preventing the piezoelectric composite film 30 from attracting or contacting the first protective layer 20.

Based on the above, through the silicon perforation technology, the overall pad 51, 53 can be transferred to the back of the piezoelectric micromachined ultrasonic transducer, so that a complete flat surface can be provided to facilitate a flat attachment to the surface of the electronic device, and the overall thickness of the package structure can be reduced, which facilitates assembly design of various electronic devices.

Although the disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A package structure of a piezoelectric micromachined ultrasonic transducer, comprising:
   a silicon substrate, provided with a first through hole and a second through hole;
   a first protective layer, on the silicon substrate and provided with a groove, a first communication hole and a second communication hole, the first communication hole communicating with the first through hole, the second communication hole communicating with the second through hole, and the first communication hole and the second communication hole not communicating with the groove;
   a piezoelectric composite film, on the first protective layer, a vertical projection of the piezoelectric composite film at least partially overlapping with the groove, the piezoelectric composite film comprising a first electrode layer and a second electrode layer, a first connecting portion of the first electrode layer being exposed to the first communication hole and first through hole, and a second connecting portion of the second electrode layer being exposed to the second communication hole and the second through hole;
   a first metal layer, filling the first communication hole and the first through hole and connected to the first connecting portion;
   a second metal layer, filling the second communication hole and the second through hole and connected to the second connecting portion;
   a first pad and a second pad, at a side of the silicon substrate opposite to the first protective layer and respectively connected to the first metal layer and the second metal layer; and
   a second protective layer, on the piezoelectric composite film, a surface of the second protective layer away from the piezoelectric composite film being a flat surface, and the second protective layer and the piezoelectric composite film jointly closing the groove to form an enclosed cavity.

2. The package structure of a piezoelectric micromachined ultrasonic transducer according to claim 1, wherein a metal bottom layer is further comprised between the first communication hole, the first through hole and the first metal layer, and between the second communication hole, the second through hole and the second metal layer.

3. The package structure of a piezoelectric micromachined ultrasonic transducer according to claim 1, wherein the piezoelectric composite film is provided with at least two communication channels, the two communication channels running through the piezoelectric composite film and communicating with the groove, and the second protective layer filling the two communication channels and closing the groove to form the enclosed cavity.

4. The package structure of a piezoelectric micromachined ultrasonic transducer according to claim 3, further comprising a support column in the enclosed cavity, wherein the support column abuts against the piezoelectric composite film and the first protective layer, a minimum distance between a side wall surface of the enclosed cavity and the support column being a first distance, a second distance between the two communication channels being greater than twice the first distance, a ratio of a height of the support column to the first distance being 1/70 to 1/200, and a width of the support column being 3 um to 10 um, wherein areas in the enclosed cavity other than the support column communicate with each other.

5. The package structure of a piezoelectric micromachined ultrasonic transducer according to claim 4, further comprising a second support column, the second support column being in the enclosed cavity, wherein the second support column abuts against the piezoelectric composite film and the first protective layer, and areas in the enclosed cavity other than the support column and the second support column communicate with each other.

6. The package structure of a piezoelectric micromachined ultrasonic transducer according to claim 4, wherein the first distance is less than or equal to 150 um.

7. The package structure of a piezoelectric micromachined ultrasonic transducer according to claim 6, wherein the first distance is 10 um to 40 um.

8. The package structure of a piezoelectric micromachined ultrasonic transducer according to claim 1, wherein the piezoelectric composite film comprises a first piezoelectric layer, the first electrode layer, a second piezoelectric layer and the second electrode layer sequentially stacked on the first protective layer, the first piezoelectric layer being provided with a first opening to expose the first connecting portion, and the first piezoelectric layer and the second piezoelectric layer being provided with a second opening to expose the second connecting portion.

9. The package structure of a piezoelectric micromachined ultrasonic transducer according to claim 8, wherein the piezoelectric composite film further comprises a third piezoelectric layer, the third piezoelectric layer covering the second electrode layer and contacting the second protective layer.

10. The package structure of a piezoelectric micromachined ultrasonic transducer according to claim 9, wherein a thickness of the first piezoelectric layer is 10 nm to 40 nm, a thickness of the first electrode layer and the second electrode layer is 150 nm to 300 nm, a thickness of the third piezoelectric layer is 150 nm to 250 nm, a thickness of the second piezoelectric layer is 0.8 um to 1.2 um, a thickness of the second protective layer is 1.6 um to 2.4 um, and a distance between the first protective layer and the first piezoelectric layer is 800 nm to 1200 nm.

* * * * *